US011495565B2

(12) United States Patent
Motoyoshi

(10) Patent No.: US 11,495,565 B2
(45) Date of Patent: Nov. 8, 2022

(54) STACKED SEMICONDUCTOR DEVICE AND MULTIPLE CHIPS USED THEREIN

(71) Applicant: TOHOKU-MICROTEC CO., LTD., Sendai (JP)

(72) Inventor: Makoto Motoyoshi, Sendai (JP)

(73) Assignee: Tohoku-Microtec Co., LTD., Sendai (JP)

( * ) Notice: Subject to any disclaimer, the term of this patent is extended or adjusted under 35 U.S.C. 154(b) by 36 days.

(21) Appl. No.: 17/255,814

(22) PCT Filed: Nov. 6, 2019

(86) PCT No.: PCT/JP2019/043453
§ 371 (c)(1),
(2) Date: Dec. 23, 2020

(87) PCT Pub. No.: WO2020/105432
PCT Pub. Date: May 28, 2020

(65) Prior Publication Data
US 2021/0280546 A1  Sep. 9, 2021

(30) Foreign Application Priority Data
Nov. 21, 2018 (JP) .............................. JP2018-218710

(51) Int. Cl.
*H01L 23/00* (2006.01)
*H01L 23/498* (2006.01)
*H01L 25/065* (2006.01)

(52) U.S. Cl.
CPC ........ *H01L 24/13* (2013.01); *H01L 23/49811* (2013.01); *H01L 24/81* (2013.01);
(Continued)

(58) Field of Classification Search
None
See application file for complete search history.

(56) References Cited

U.S. PATENT DOCUMENTS 10,468,365 B2  11/2019 Kishihara et al.
2008/0017873 A1*  1/2008 Tomoda ............... H01L 24/11
257/E23.021
(Continued)

FOREIGN PATENT DOCUMENTS

JP  07-211720 A  8/1995
JP  08-340000 A  12/1996
(Continued)

OTHER PUBLICATIONS

Extended European Search Report dated Feb. 18, 2022, 8 pages, for the corresponding European Patent Application No. 19887548.6.

*Primary Examiner* — Long Pham
(74) *Attorney, Agent, or Firm* — Polsinelli PC

(57) ABSTRACT

A stacked semiconductor device encompasses a mother-substrate, rectangular chips mounted on the mother-substrate, and bump-connecting mechanisms connecting the mother-substrate and the chips by a non-provisional joint-process with a height lower than the height of a provisional joint-process jointing the mother-substrate and the chips. The mother-substrate has unit elements arranged in each of unit-element areas assigned to a first lattice defined on a first main surface of the mother-substrate, the first main surface is divided into chip-mounting areas along a second lattice having a smaller number of meshes than the first lattice. The bump-connecting mechanisms are arranged along a third lattice corresponding to the arrangement of the unit elements, and transmit signals from the unit elements independently to each of the circuits merged in the chips. After the provisional joint-process, the bump-connecting mechanisms can be separated into substrate-side and chip-side connection-elements.

10 Claims, 10 Drawing Sheets

(52) U.S. Cl.
CPC .............. *H01L 25/0655* (2013.01); *H01L 2224/13016* (2013.01); *H01L 2224/81052* (2013.01)

(56) References Cited

U.S. PATENT DOCUMENTS

| | | |
|---|---|---|
| 2014/0252604 A1 | 9/2014 | Motoyoshi |
| 2015/0235984 A1 | 8/2015 | Aoyagi et al. |
| 2018/0331060 A1 | 11/2018 | Kishihara et al. |

FOREIGN PATENT DOCUMENTS

| | | |
|---|---|---|
| JP | 2010-040884 A | 2/2010 |
| WO | WO 2014/006812 A1 | 1/2014 |
| WO | WO 2014/136241 A1 | 9/2014 |
| WO | WO 2017/081798 A1 | 5/2017 |

\* cited by examiner

STACKED SEMICONDUCTOR DEVICE AND MULTIPLE CHIPS USED THEREIN

TECHNICAL FIELD

The present invention relates to a stacked semiconductor device and multiple chips used in the stacked semiconductor device, particularly pertains to a repair technology of the stacked semiconductor device having a stacked structure, which encompasses a larger-size mother-substrate and a plurality of chips mounted on the mother-substrate.

BACKGROUND ART

Patent Literature (PTL) 1 discloses a two-dimensional radiation detector having an active matrix substrate including pixel electrodes and a counter substrate bonded to the active matrix substrate by conductive bumps, which are connected to each of the pixel electrodes. In such flip-chip bonding, there was a problem that the connection becomes difficult by uniform bumps, when the pitch of the pixel electrodes becomes finer and finer. In contrast, PTL 2 discloses a solid-state detector capable of performing a reliable connection by cylindrical electrodes, which connect between each of the pixel electrodes of the signal-read-out chip and the opposing substrate.

However, in the stacked semiconductor device in which a plurality of smaller-size circuitry-chips are mounted on a larger-size mother-substrate, when there is a defect in any of the circuitry-chips on which minute circuit-patterns are integrated, there is a problem that the stacked semiconductor device does not operate. As to the larger-size mother-substrate used in an image sensor, etc., because a plurality of detection elements is delineated on the mother-substrate as pixels under a lax and lough design rule with a simple circuit pattern, such a mother-substrate is easy to manufacture, and the probability of defect occurrence is low. Further, if a defect is generated in any of the unit elements or the connection wirings, etc., of the mother-substrate, as the generation of defects is random, the defect is hardly observed from the output side of the mother-substrate.

On the other hand, because each of the circuitry-chips, to be mounted on the mother-substrate of a larger rectangular diameter, has a high integration degree, or because each of the circuitry-chips is manufactured under much finer design rules than the mother-substrate, the probability of defect occurrence is high in the circuitry-chips. However, the behavior of each of the circuits merged in the respective circuitry-chips cannot be known until testing is conducted, after mounting the circuitry-chips on the mother-substrate through the connections with bumps, etc. Therefore, in a case of a higher defect occurrence rate in any of the circuitry-chips, or if there is a block failure in any of the circuitry-chips, the entire stacked semiconductor device becomes defective. And the defect of the stacked semiconductor device results in lower manufacturing efficiency, and furthermore, the defect of the stacked semiconductor device wastes the mother-substrate and normally operating circuitry-chips mounted on the substrate.

Under such circumstances, it is desirable to peel off selectively the defective circuitry-chip from the mother-substrate and to replace selectively the defective circuitry-chip with another circuitry-chip operating normally. However, no bump, etc., is known, which facilitates only a specific circuitry-chip can be easily peeled off when the specific circuitry-chip is found to be defective, and then another circuitry-chip can be mounted on the mother-substrate by the same bump, at the present technical level.

CITATION LIST

Patent Literature

[PTL 1] WO2014/006812A
[PTL 2] PCT/JPO2017/081891

SUMMARY OF INVENTION

Technical Problem

Given the above problems, the object of this invention is to provide a stacked semiconductor device and a plurality of chips used in the stacked semiconductor device, facilitating the processing of the repair of the mounted chip, shortening manufacturing time, and preventing the waste of resources.

Solution to Problem

To achieve the above-mentioned object, a first aspect of the present invention inheres in a stacked semiconductor device encompassing (a) a mother-substrate having a first main surface and a second main surface facing to the first main surface, and a plurality of unit elements arranged in each of unit-element areas assigned to a first lattice defined on the first main surface, the first main surface is divided into a plurality of chip-mounting areas along a second lattice having a smaller number of meshes than the first lattice, (b) a plurality of rectangular chips mounted on the first main surface side, each of the chips facing to corresponding site of the chip-mounting areas, respectively, and (c) a plurality of bump-connecting mechanisms connecting the mother-substrate and each of the chips by a non-provisional joint-process with a height lower than the height of a provisional joint-process jointing the mother-substrate and the plurality of the chips, being arranged along a third lattice corresponding to the arrangement of the plurality of the unit elements, configured to transmit signals from the plurality of the unit elements independently to each of the circuits merged in the plurality of the chips. In the stacked semiconductor device pertaining to the first aspect, after the provisional joint-process, the plurality of the bump-connecting mechanisms can be separated into a plurality of substrate-side connection-elements and a plurality of chip-side connection-elements, each of which corresponds to the plurality of the substrate-side connection-elements.

A second aspect of the present invention inheres in a combination of a plurality of chips, each of the chips is supposed to be mounted respectively on corresponding chip-mounting areas defined on a mother-substrate, the mother-substrate having a first main surface and a second main surfaces facing to the first main surface, and a plurality of unit elements are arranged in each of unit-element areas assigned to a first lattice defined on the first main surface, the first main surface is divided into the chip-mounting areas along a second lattice having a smaller number of meshes than the first lattice, the mother-substrate has a plurality of substrate-side connection-elements for delivering each of signals from the plurality of the unit elements, each of the substrate-side connection-elements is assigned to a third lattice defined on the first main surface so that third lattice corresponds to an array of the unit elements, the number of chips is larger than the number of meshes of the second lattice. Each of the chips pertaining to the second aspect encompasses a plurality of chip-side connection-elements feeding the signals to a circuit merged in each of the chips, arranged along the third lattice on a chip surface of each of the chips, the chip surface is facing to the first main surface. In the second aspect of the present invention, the mother-substrate and the plurality of the chips are provisionally jointed, and signals from the plurality of the unit elements are independently transmitted to circuits merged in the plurality of the chips to inspect normal operations of the chips. In a case of a defect determination such that a specific chip is determined to be defective, the specific chip is removed from the chip mounting area, and a new chip is provisionally jointed again, while all of the chips mounted on the mother-substrate is determined to be normal, the mother-substrate and the plurality of the chips are coupled to each other, by a non-provisional joint-process of compressing a height of the chip-side connection-element, decreasing the height lower than the value of the provisional joint-process.

Advantageous Effects of Invention

The present invention can provide a stacked semiconductor device and a plurality of chips used in the stacked semiconductor device to facilitate the repair processing of the chips mounted on the mother-substrate of a larger size, shorten the manufacturing time, and prevent the waste of resources.

DESCRIPTION OF EMBODIMENTS

Figure 1:
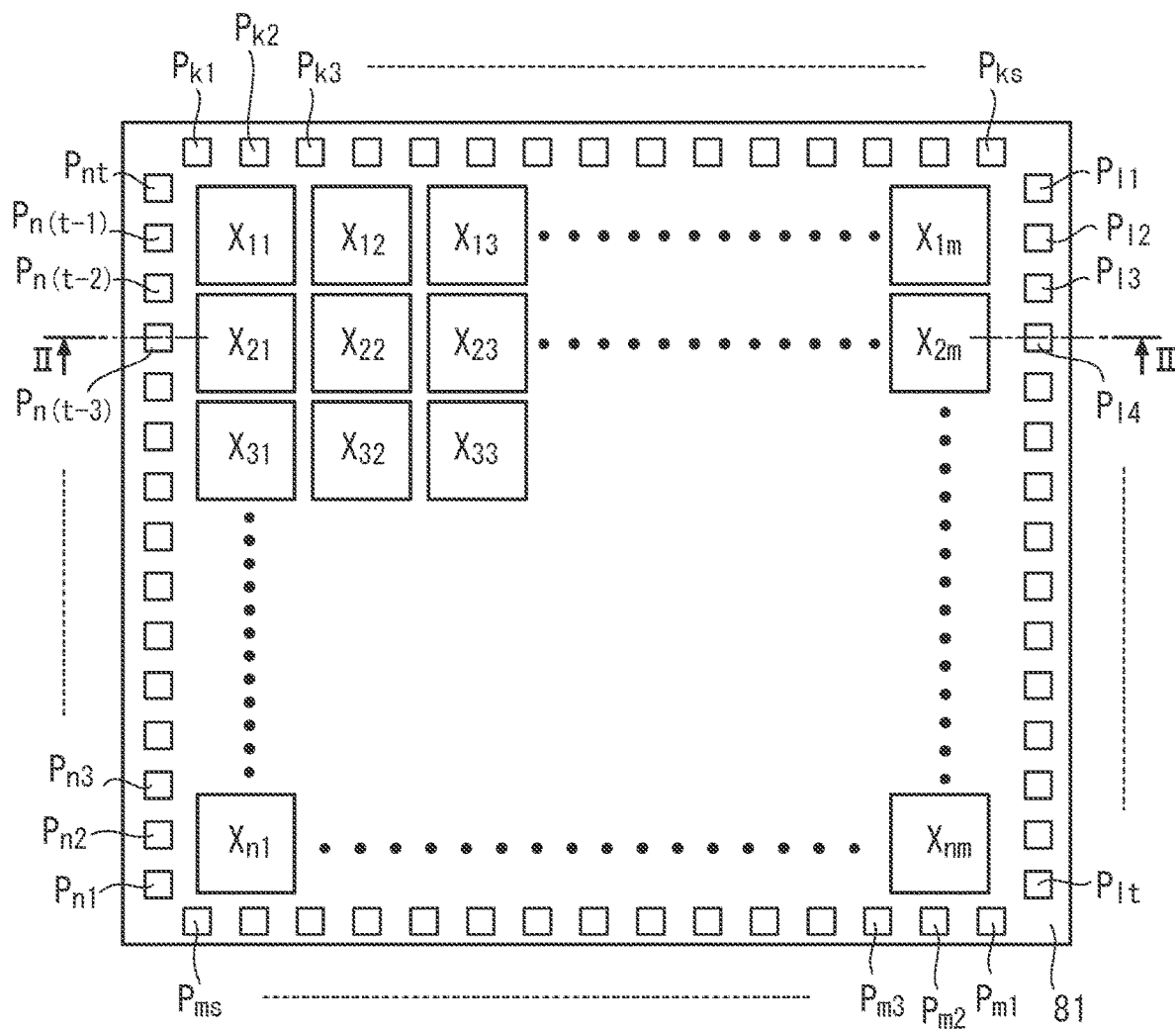
FIG. 1 is a plan view for explaining a stacked semiconductor device, or a solid-state imaging device according to a first embodiment of the present invention.

Hereinafter, first and second embodiments of the present invention will be described with reference to the drawings. In the description of the drawings, the identical or similar parts are denoted by the identical or similar reference numerals, and redundant descriptions thereof will be omitted. However, the drawings are schematic, and the relation between the thickness and the plane dimensions, the ratio of the thickness of each layer, etc., may be different from the actual one. In addition, dimensional relations and ratios may also differ between the drawings. Further, the first and second embodiments illustrated below exemplify the apparatus and methods for embodying the technical idea of the present invention, and the technical idea of the present invention does not specify the material, shape, structure, arrangement, or the like of the components as follows.

Further, the definition of the "upper", "lower", and the like, in the following description is merely a definition for convenience of explanation, and is not intended to limit the technical scope of the present invention. For example, the upper and lower are converted to right and left if observed by rotating the object by 90°, and the upper and lower are inverted if observed by rotating 180°, of course.

First Embodiment

Figure 2:
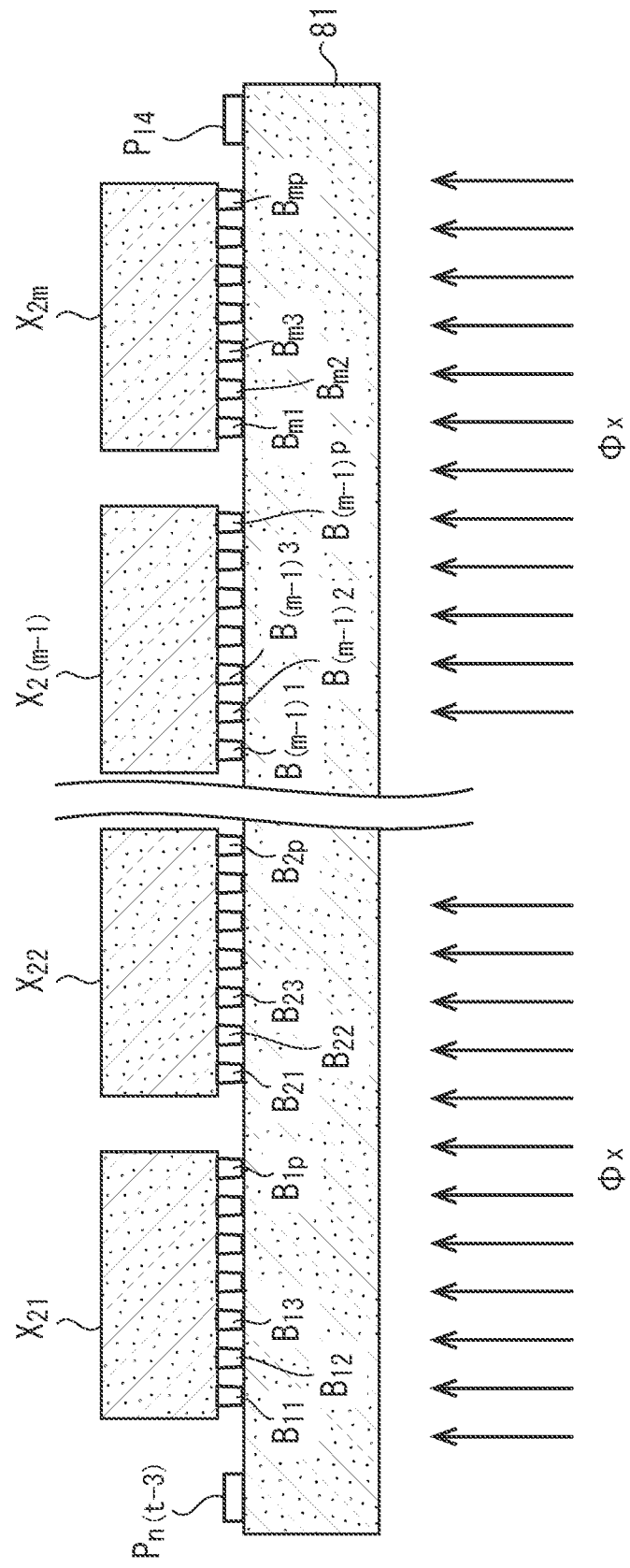
FIG. 2 is a cross-sectional view taken from the II-II direction of FIG. 1.

A Stacked-semiconductor device according to a first embodiment of the present invention inheres in a stacked structure encompassing a larger-size mother-substrate 81, and a plurality of rectangular chips $X_{ij}$ (i=1-n: j=1-m) mounted on a first main surface, or a connection surface, which is one of main surfaces of the mother-substrate 81, as illustrated in FIGS. 1 and 2. A second main surface faces the first main surface in parallel. If the stacked semiconductor device is a solid-state imaging device, the second main surface facing the first main surface of the mother-substrate 81 implements an entrance surface on which electromagnetic wave $\Phi_x$ is incident as illustrated in FIG. 2. On the first main surface, or the connection surface of the mother-substrate 81, a plurality of unit-element areas, or a plurality of pixel areas are defined along a first lattice, and each of the unit elements, or each of the detection elements is assigned to the corresponding unit-element area.

The first main surface of the mother-substrate 81 is divided into a plurality of chip-mounting areas defined by a second lattice with fewer meshes than the first lattice. Each of the chips $X_{ij}$ reads out signals respectively from corresponding chip-mounting areas, which are divided at the main surface of the mother-substrate 81. Conversely, corresponding to the arrangement positions of each of the chips $X_{ij}$, the first main surface of the mother-substrate 81 is divided into a plurality of chip-mounting areas organizing the second lattice of n×m, which is smaller in mesh number than the first lattice.

As a structure of the mother-substrate 81, the unit elements, or the detection elements such as p-n diodes, n-i-n diodes, and p-i-p diodes are respectively arranged in the corresponding unit-element areas, or the corresponding pixel areas, which are assigned along the first lattice. For example, the size of the mother-substrate 81 is 10 cm×10 cm. Each of the chips $X_{ij}$ has a smaller area than the mother-substrate 81 and is arranged in each of the corresponding areas defined by the second lattice. Although a size of the second lattice depends on the rectangular diameter of the mother-substrate 81, such as 2×2 to 8×8 matrix, the chips $X_{ij}$ cover almost the entire surface of the mother-substrate 81.

In a planar pattern illustrated by FIG. 1, a plurality of bonding pads $P_{k1}, P_{k2}, P_{k3}, \ldots$, and $P_{ks}$ is linearly arranged around a periphery of the mother-substrate 81 along the top row of the chips $X_{11}, X_{12}, X_{13}, \ldots$, and $X_{1m}$ of a matrix. If a side of the mother-substrate 81 along which the bonding pads $P_{k1}, P_{k2}, P_{k3}, \ldots$, and $P_{ks}$ are arranged is defined as the "first side," bonding pads $P_{11}, P_{12}, P_{13}, \ldots$, and $P_{1t}$ are arranged around the mother-substrate 81 along the second side of the mother-substrate 81, the second side is continuous with the first side and perpendicular to the first side. Bonding pads $P_{m1}, P_{m2}, P_{m3}, \ldots$, and $P_{ms}$ are arranged around the mother-substrate 81 along the third side of the mother-substrate 81, continuous with the second side and perpendicular to the second side. Bonding pads $P_{n1}, P_{n2}, P_{n3}, \ldots$, and $P_{nt}$ are arranged around the mother-substrate 81 along the fourth side of the mother-substrate 81, continuous with the third side and perpendicular to the third side.

The cross-sectional view of FIG. 2 illustrates a row implemented by a plurality of bump-connecting mechanisms $B_{11}, B_{12}, B_{13}, \ldots$, and $B_{1p}$ in a matrix, each of the matrices of the bump-connecting mechanisms may be assigned to each area in a third lattice, the third lattice has the same number of meshes as the first lattice, for example. The bump-connecting mechanisms $B_{11}, B_{12}, B_{13}, \ldots$, and $B_{1p}$ are deployed between a chip $X_{21}$ allocated at the left end of the mother-substrate 81 and the mother-substrate 81. The mesh pitch of the third lattice may be the same as that of the first lattice, but also the mesh pitch of the third lattice can have a value obtained by converting the pitch of the first lattice. Further, between a chip $X_{22}$ allocated at the right side of the chip $X_{21}$ and the mother-substrate 81, another row implemented by a plurality of bump-connecting mechanisms $B_{21}, B_{22}, B_{23}, \ldots$, and $B_{2p}$ in a matrix, each of the matrices of the bump-connecting mechanisms is assigned to each site of the third lattice, is illustrated. Similarly, between a chip $X_{2(m-1)}$ and the mother-substrate 81, further another row implemented by a plurality of bump-connecting mechanisms $B_{(m-1)\,1}, B_{(m-1)\,2}, B_{(m-1)\,3}, \ldots$, and $B_{(m-1)\,p}$ in a matrix, each of the matrices of the bump-connecting mechanisms is assigned to each site of the third lattice, is illustrated.

Further, between a chip $X_{2m}$ allocated on the right end side of the mother-substrate 81 and the mother-substrate 81, still further another row implemented by a plurality of bump-connecting mechanisms $B_{m1}, B_{m2}, B_{m3} \ldots$ and $B_{mp}$ in a matrix, each of the matrices of the bump-connecting mechanisms is assigned to each site of the third lattice, is illustrated. That is, FIG. 2 illustrates only a representative cross-sectional structure corresponding to each of one row in the matrices, as the arrangements of a plurality of bump-connecting mechanisms $B_{uv}$ (u=1-m, v=1-p) between a plurality of chips $X_{ij}$ and the mother-substrate 81. However, because each of the matrices is assigned to the planar pattern of the first lattice defining the unit elements—the detection elements—, it is natural that similar cross-sectional structures exist elsewhere at a rearward portion of the paper illustrating the cross-section of FIG. 2, or at the near side of the paper. FIG. 2 illustrates a bonding pad $P_{n(t-3)}$ at the left side of the array of the chips $X_{21}, X_{22}, X_{23}, \ldots$, and $X_{2m}$, and a bonding pad $P_{14}$ at the right side of the array of the chips $X_{21}, X_{22}, X_{23}, \ldots$, and $X_{2m}$.

In the following explanation, a plurality of bump-connecting mechanisms, including other bump-connecting mechanisms present elsewhere other than in the cross-section of FIG. 2, are collectively referred to as "bump-connecting mechanism $B_{uv}$." Each of a plurality of bump-connecting mechanisms $B_{uv}$ electrically connect each unit element (detection element) arranged in the unit-element areas, or the pixel areas assigned to the first lattice on the first main surface, or the connection surface of the mother-substrate 81 and each of the corresponding chips $X_{ij}$ independently of each other.

Since the mother-substrate 81 is manufactured according to a lax and lough design rule and has a simple circuit-layout pattern, it is easy to manufacture, and the probability of defect occurrence is low. Further, defects in the unit elements or in the connection wirings, etc., of the mother-substrate 81, if any, is random, and the defects are hardly observed from the output side of the mother-substrate 81. On the other hand, each of the chips $X_{ij}$ has a high degree of integration, and the performance and behavior of the circuit merged in each of the chips $X_{ij}$ cannot be known until testing is conducted, after connecting each of the chips $X_{ij}$ to the mother-substrate 81 by the bump-connecting mechanism $B_{uv}$. As a plurality of the chips $X_{ij}$ is mounted on the mother-substrate 81, if there is a high defect-occurrence rate or a block failure in any one of the chips $X_{ij}$, a failure of the stacked semiconductor device according to the first embodiment is caused by the high defect-occurrence rate or the block failure.

Therefore, if any defect in the circuit merged in a specific chip $X_{st}$ is found by a provisional joint-process, or a temporary joint-process of each chip $X_{ij}$ to the mother-substrate 81, a repair process is required so that the defective chip $X_{st}$ is peeled off, and then a next provisional joint-process with another chip $X_{xy}$ is made, in order to check again if there is any problems in the chip $X_{xy}$. Since the repair process is scheduled, the number of chips $X_{ij}$ prepared is more than the mesh number of the second lattice defined in the mother-substrate 81.

Figure 4:
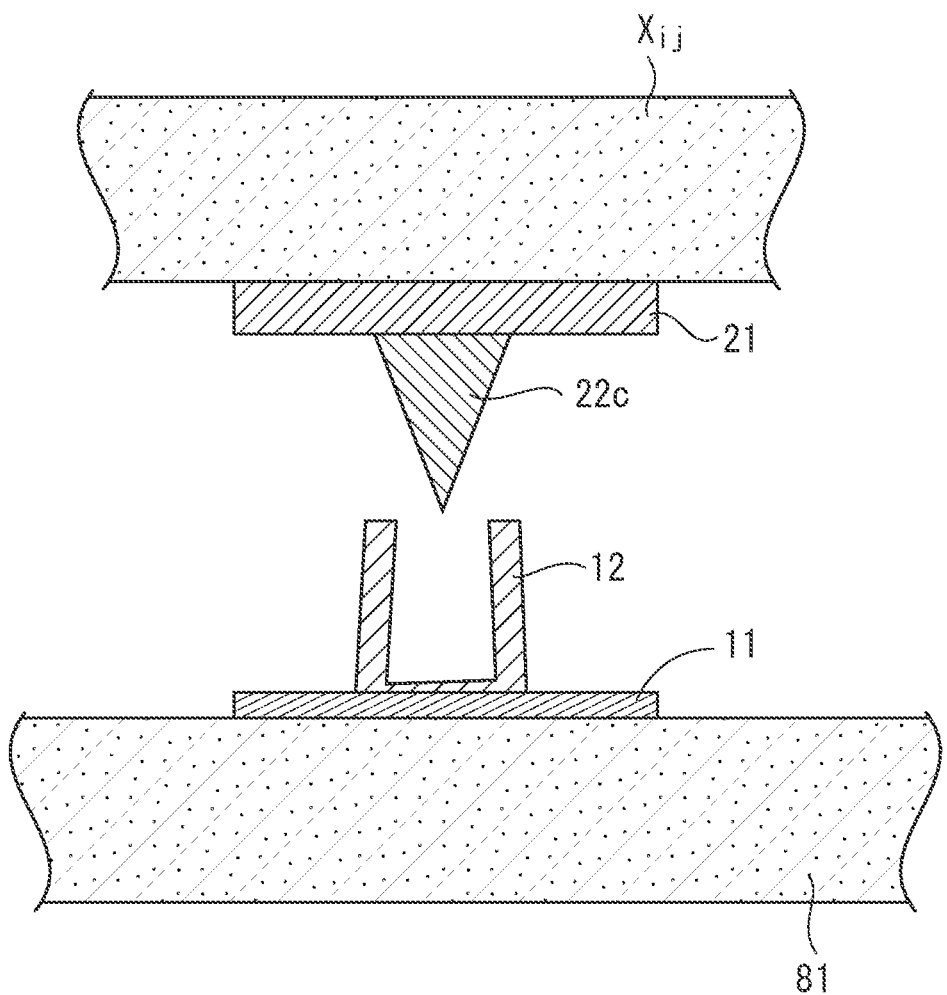
FIG. 4 is a schematic cross-sectional view for explaining the state of re-separation when a defect is found by the provisional joint-process of the bump-connecting mechanism of the stacked semiconductor device according to the first embodiment.
Figure 5:
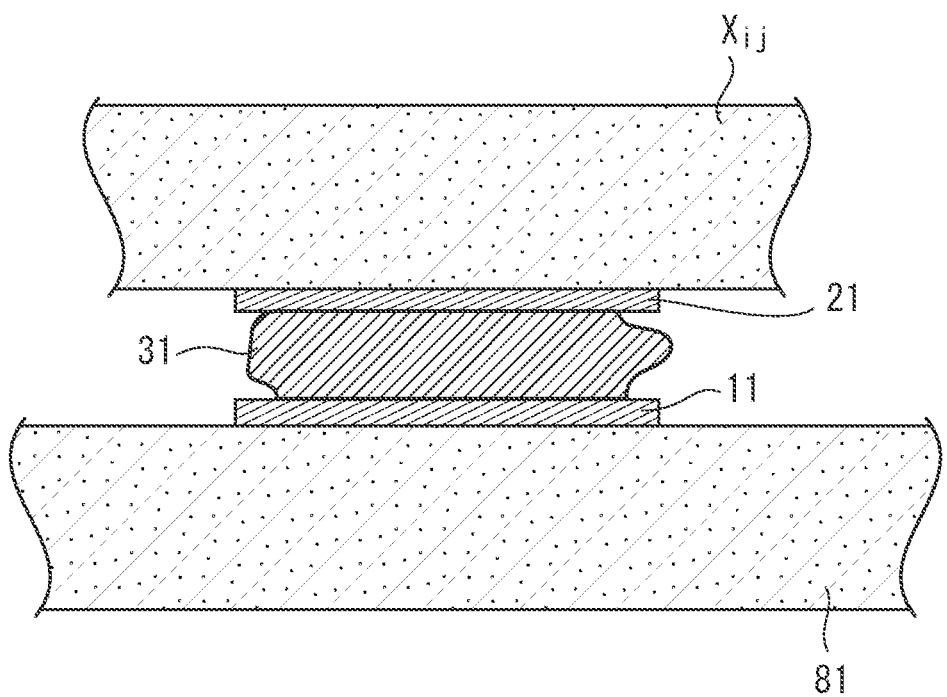
FIG. 5 is a schematic cross-sectional view for explaining the state of the non-provisional joint-process of the bump-connecting mechanism of the stacked semiconductor device according to the first embodiment.

The details of the bump-connecting mechanism $B_{uv}$ will be described later with reference to FIGS. 3-5. The bump-connecting mechanism $B_{uv}$ is arranged along the third lattice corresponding to the array of the plurality of unit elements in the mother-substrate 81, between the first main surface of the mother-substrate 81 and each surface (chip surface) of the plurality of chips $X_{ij}$ facing to the first main surface. The bump-connecting mechanisms $B_{uv}$ are arranged to independently transmit signals from the plurality of unit elements integrated on the mother-substrate 81 to corresponding circuits merged in each of the plurality of chips $X_{ij}$.

If the stacked semiconductor device according to the first embodiment is supposed to be a solid-state imaging device, the array of the unit elements, or the detection elements arranged on the first main surface, or the connection surface of the mother-substrate 81 shall correspond to the array of pixels of an image sensor as the stacked-semiconductor device. Each of the signal-readout circuits in the plurality of chips $X_{ij}$ may include a switching element $Q_{ij}$ and a buffer amplifier circuit. Each of the plurality of chips reads out signals from the pixels arranged at each of the corresponding divisional sites defined by the first lattice, which is delineated on the first main surface of the mother-substrate 81.

The following first embodiment description will not limit the material or application fields of the mother-substrate 81. That is, if the stacked semiconductor device according to the first embodiment is supposed to be a solid-state imaging device and the mother-substrate 81 is made of silicon (Si), the stacked semiconductor device according to the first embodiment can serve as a solid-state imaging device, which may be suitable as an image sensor for the visible-light wavelength region. Further, in the case where the stacked semiconductor device according to the first embodiment is supposed to be the solid-state imaging device, an architecture such that a plurality of unit elements, or the plurality of detection elements are arranged on the mother-substrate 81 may be suitable as a radiation image sensor, if the detection elements are made of a compound semiconductor such as cadmium telluride (CdTe), zinc telluride (ZnTe), cadmium zinc telluride (CdZnTe), or gallium arsenide (GaAs).

Further, if a plurality of infrared-detection elements made of germanium (Ge), or a semi-metal such as mercury cadmium tellurium (HgCdTe), indium antimony (InSb), etc., is arranged on the mother-substrate 81, an infrared image sensor may be established. Therefore, the stacked semiconductor device according to the first embodiment can be applied to, for example, various image sensors for detecting electromagnetic waves having various wavelengths, but the stacked semiconductor device is not limited to a solid-state imaging device, or the image sensor.

The mother-substrate 81 arranges the substrate-side connection-elements to implement each of the plurality of the bump-connecting mechanisms $B_{uv}$, respectively, such that the substrate-side connection-elements are assigned to each site of the third lattice. The array of the substrate-side connection-elements correspond to the array of the plurality of the unit elements, which is deployed on the first main surface, or the connection surface, on which one of electrodes of the plurality of the unit elements, or the detection elements is exposed. As illustrated in FIG. 3, each of the substrate-side connection-elements has a first land 11 and a first bump 12 whose bottom surface is in contact with the first land 11.

If the stacked semiconductor device according to the first embodiment is a solid-state imaging device, the signals are read out from the first land 11 of each unit element. The signals are carriers generated as electron-hole pairs in each carrier-generating layer in the unit elements, or in the detection elements arranged at the unit-element areas—the pixel areas assigned to the first lattice defined on the mother-substrate 81. As illustrated in FIG. 3, a portion of the mother-substrate 81 corresponding to the first land 11 implements each of the unit elements serving as the detection elements assigned to each of the pixels, and each of the unit element delivers signals corresponding to the amounts of electromagnetic waves received. Each of the chips $X_{ij}$ has a bottom surface (chip surface) of the chip $X_{ij}$ as a readout-circuit main-surface.

If the stacked semiconductor device according to the first embodiment is supposed to be a solid-state imaging device, the first land 11 is two-dimensionally arranged on the bottom surface, or on the chip surface of each of the chips $X_{ij}$ to be separated from each other, and the signals indicating carriers generated in the mother-substrate 81 are read out using the first land 11 as an output electrode. As a result, the mother-substrate 81 functions as "a detection substrate" for detecting electromagnetic waves, while the first land 11 functions as the output electrode of the unit element, and the first land 11 delivers carrier-signals from each of the unit elements, or the pixels.

Although the illustration of the detailed structure is omitted, for example, each of the chips $X_{ij}$ may have a laminated structure of a support substrate made of a semiconductor substrate and a circuit-embedding insulating-layer arranged on the support substrate. Inside the circuit-embedding insulating-layer, an intermediate-level interconnection and a lower-level interconnection are buried, being mutually separated, to implement a thin-film integrated-circuit. The structure of the thin-film integrated-circuit implements each of the signal-readout circuits for each of the unit elements— each of the pixels—. The circuit-embedding insulating-layer can embrace three or more insulating-layers. Actually, if the support substrate is supposed to be a silicon (Si) substrate, circuits including a set of a readout capacitor and a switching element corresponding to each unit element may be implemented, by integrating the set of the readout capacitor and the switching element in the upper part of the support substrate of each of the chips $X_{ij}$.

When each of the chips $X_{ij}$ is Si substrate, and the integrated circuit is formed at the surface of the Si substrate, the circuit-embedding insulating-layer functions as "a multi-level interconnection-layer" on the surface. Alternatively, the switching element made of a thin film transistor or the readout capacitor may be constructed in the inside the multi-level interconnection-layer using intermediate-level interconnection and lower-level interconnection via an inter-layer insulating-film. Alternatively, the structure of FIG. 2 may be read as follows: the circuit on the lower wiring side in the multi-level interconnection-layer of each of the chips $X_{ij}$ corresponds to the integrated circuit formed on the surface of the Si substrate, and the intermediate-level interconnection in the multi-level interconnection-layer corresponds to the surface wiring layer in the interlayer insulating-film.

Whether the signal-readout circuit is built by the integrated circuit at the surface of the Si substrate that implements each of the chips $X_{ij}$ or the signal-readout circuit is built by the intermediate-level interconnection and the lower-level interconnection, or alternatively, is built by other configurations, the signal-readout circuit of each unit element is connected to the first land 11. That is, the signal-readout circuit of the chip $X_{ij}$ is connected to a second land 21, which is connected to the second bump 22c, and the second bump 22c is metallurgically jointed to a first bump 12, which is further connected to the first land 11. Here, the second land 21 and the second bump 22c construct "a chip-side connection-element", which implements a component of each of the bump-connecting mechanisms $B_{uv}$. As a result, the signals are transmitted from the mother-substrate 81 to each of the signal-readout circuits via the first land 11. Therefore, the chip $X_{ij}$ functions as "a read-out chip" having input electrodes on which the plurality of signal-readout circuits for reading signals from the mother-substrate 81 are arranged along the third lattice according to the pixel array. Further, the plurality of the second lands 21 functions as input electrodes, and the second lands 21 readout signals from each of the unit elements through the first lands 11, respectively, feeding the signals to each of the integrated circuits merged in the chip $X_{ij}$.

In the stacked semiconductor device according to the first embodiment, for convenience of explanation, it is assumed that the intermediate-level and lower-level interconnections of the chip $X_{ij}$ implement the signals-readout circuit, which is made by a scheme of thin-film circuit. In this case, the chip $X_{ij}$ may have a plurality of first wiring-pattern layers arranged on a top surface of the support substrate, a plurality of through-vias penetrating the support substrate from the top surface to the bottom surface, and a plurality of second wiring-pattern layers arranged on the bottom surface of the support substrate, etc. Each of the first wiring-pattern layers is electrically connected to an array of lower-level interconnection, the array may correspond to one of the rows in a matrix. Each of the through-vias of the chips $X_{ij}$ electrically connects the first wiring-pattern layer and the second wiring-pattern layer. A plurality of solder bumps for bonding to an external circuit can be arranged on the bottom surface of the second wiring-pattern layer of the chip $X_{ij}$.

As already described, the chip $X_{ij}$ has a high degree of integration, and the performance and behavior of the circuit merged in the chip $X_{ij}$ cannot be known until testing is conducted, after jointing the chip $X_{ij}$ to the mother-substrate 81 with the bump-connecting mechanism $B_{uv}$. If a circuit merged in a specific chip $X_{st}$ is defective, the entire stacked semiconductor device according to the first embodiment illustrated in FIGS. 1 and 2 becomes defective. Therefore, it is necessary to provisionally or temporarily assemble all chips $X_{ij}$ to the mother-substrate 81, and confirm whether or not the circuit merged in the specific chip $X_{st}$ has the defect. Therefore, as illustrated in FIG. 3, according to the bump-connecting mechanism $B_{uv}$ of the stacked semiconductor device pertaining to the first embodiment, the first bump 12 with its bottom portion bonded to the first land 11 and the second bump 22c with its bottom surface (chip surface) bonded to the second land 21 are brought into contact with each other so as to execute a provisional joint-process (an interim joint-process).

Figure 3:
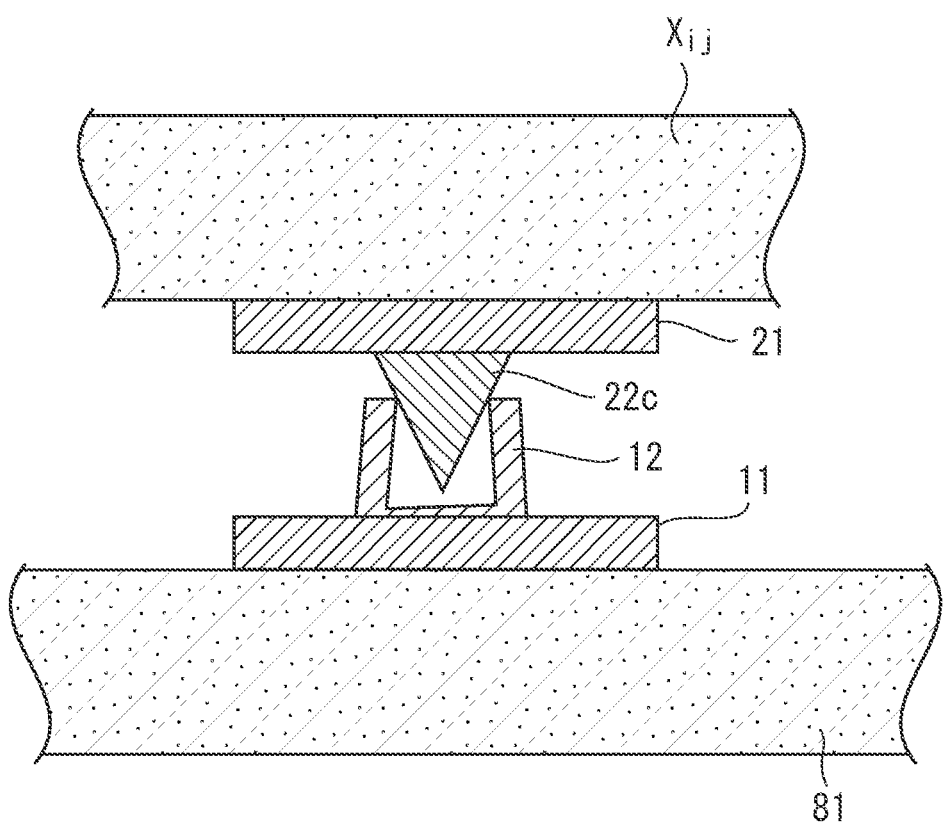
FIG. 3 is a schematic cross-sectional view for explaining a state of provisional joint-process of the bump-connecting mechanism of the stacked semiconductor device according to the first embodiment.

As illustrated in FIG. 3, the first bump 12 of the substrate-side connection-element, which implements the component in each of the bump-connecting mechanisms $B_{uv}$ of the stacked semiconductor device according to the first embodiment, has a tubular shape. The tubular shape of the first bump 12 has a bottom portion in contact with the first land 11, and a sidewall-portion that is connected to the outer circumference of the bottom portion. The sidewall-portion implements a peripheral wall surrounding the bottom portion. The sidewall-portion of the first bump 12 has an inverse-tapered shape, in which the inner and outer diameters decrease from the lower edge to the upper edge. With the inverse-tapered shape, when the upper edge of the sidewall-portion is pressed by the second bump 22c, the upper edge of the sidewall-portion is deformed toward inwardly so that the upper edge of the sidewall-portion is narrowed, and thereby, the first bump 12 and the second bump 22c are metallurgically or physically jointed.

The second bump 22c of the chip-side connection-element, which implements the component in each of the bump-connecting mechanisms $B_{uv}$ of the stacked semiconductor device according to the first embodiment, is a cone having a conical shape whose bottom surface (chip surface) is in contact with the second land 21. The planar pattern of the first land 11 and the second land 21 may be, for example, a square shape, but is not limited to the square shape. For example, the first bump 12 may encompasses a circular bottom portion in contact with the first land 11, and a cylindrical sidewall-portion connected to the outer periphery of the bottom portion, the cylindrical sidewall-portion implements the peripheral wall surrounding the bottom portion. And the second bump 22c may be a cone having a conical shape whose bottom surface (chip surface) is in contact with the second land 21.

Alternatively, the first bump 12 may encompasses a rectangular bottom portion in contact with the first land 11, and a quadrangular-tubular sidewall-portion connected to the outer periphery of the bottom portion, the quadrangular-tubular sidewall-portion implements the peripheral wall surrounding the bottom portion. And the second bump 22c may be a pyramid having a pyramidal shape such as a quadrangular pyramid or a triangular pyramid whose bottom surface (chip surface) is in contact with the second land 21. Further, when the first bump 12 has a rectangular bottom portion in contact with the first land 11 and a quadrangular-tubular sidewall-portion connected to the outer periphery of the bottom portion, the quadrangular-tubular sidewall-portion implements the peripheral wall surrounding the bottom portion. And, the second bump 22c may be a cone having a conical shape whose bottom surface (chip surface) is in contact with the land 21.

Figure 7A:
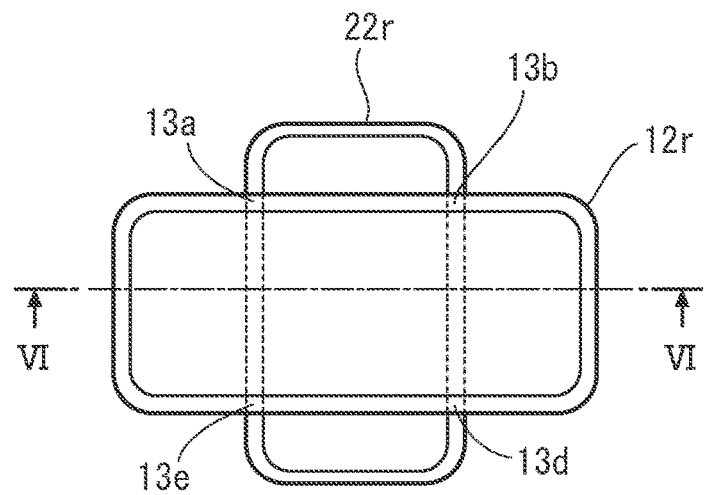
FIG. 7A is a plan view for explaining the metallurgical connection state where the rectangular tubular second bump and the rectangular tubular first bump intersect in the bump-connecting mechanism of the stacked semiconductor device according to the second embodiment.
Figure 7B:
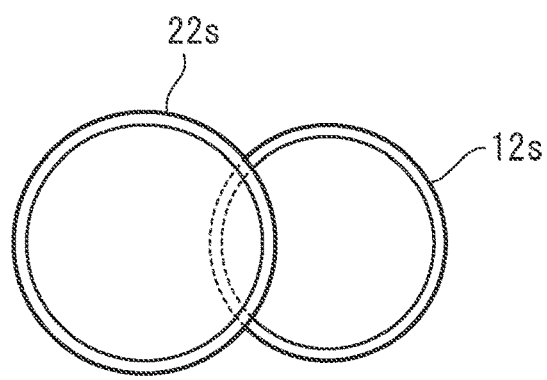
FIG. 7B is a plan view explaining a metallurgical contact state in which the cylindrical second bump and the cylindrical first bump intersect.

The planar pattern of the bump-connecting mechanism $B_{uv}$ may be a rectangular shape like the topology illustrated in FIG. 7A or a circular shape like the topology illustrated in FIG. 7B. FIG. 3 illustrates one bump-connecting mechanism among the plurality of the bump-connecting mechanisms $B_{uv}$ as a representative example. And therefore, the same structure applies to the other bump-connecting mechanisms $B_{uv}$, and the other bump-connecting mechanisms $B_{uv}$ are sandwiched between the plurality of the corresponding second lands 21 and the plurality of the corresponding first lands 21, respectively.

When the first bump 12 and the second bump 22c are provisionally jointed temporarily as illustrated in FIG. 3, the upper edge of the sidewall-portion of the first bump 12 of the stacked semiconductor device according to the first embodiment is metallurgically—physically—jointed to a part of the conical surface of the second bump 22c. As illustrated in FIG. 3, after provisionally jointing temporarily the first bump 12 and the second bump 22c, the operation of the chip $X_{ij}$ can be confirmed. If a defect in the chip $X_{ij}$ is found in the operation check of the chip $X_{ij}$ in the state where the first bump 12 and the second bump 22c are provisionally jointed temporarily, as illustrated in FIG. 4, the bump-connecting mechanisms $B_{uv}$ can be separated into the substrate-side connection-element on the land 11 side and the chip-side connection-element on the second land 21 side.

On the other hand, if the normal operation of the chip $X_{ij}$ is confirmed by checking the operation of the chip $X_{ij}$ in the state where the first bump 12 and the second bump 22c are provisionally jointed temporarily, the force for pressing the chip $X_{ij}$ against the mother-substrate further increases so that the distance between the chip $X_{ij}$ and the mother-substrate 81 further decreases. When the force for pressing the chip $X_{ij}$ against the mother-substrate 81 is further increased, the chip $X_{ij}$ and the mother-substrate 81 are non-provisionally jointed, or finally jointed as illustrated in FIG. 5. During the time of a non-provisional joint-process, or a permanent joint-process between the first bump 12 and the second bump 22c, the sidewall-portion of the first bump 12 is deformed by pressing as illustrated in FIG. 5, and the top of the lower edge side of the second bump 22c is metallurgically jointed to the bottom portion of the first bump 12. Since the pressing process makes compression, the height of the bump-connecting mechanism $B_{uv}$ at the stage of the non-provisional joint-process illustrated in FIG. 5 is lower than the height of the bump-connecting mechanism $B_{uv}$ during the provisional joint-process illustrated in FIG. 3.

For example, gold (Au) can be used for the first bump 12 and the second bump 22c, implementing each of components of the bump-connecting mechanisms $B_{uv}$, respectively. Furthermore, alloys that contain 80% or more of Au, such as Au-silicon (Si), Au-germanium (Ge), Au-antimony (Sb), Au-tin (Sn), Au-lead (Pb), Au-zinc (Zn), and Au-copper (Cu) can also be used. However, Au is suitable for the first bump 12 and the second bump 22c because deformations by the non-provisional joint-process and a multiple-times of the provisional joint-processes, which include a multiple-times of metallurgical jointing processes, are easily and reliably performed.

The plurality of the first bumps 12 serving respectively as components of the bump-connecting mechanisms $B_{uv}$ have the same dimension, mutually. And, the height of the first bumps 12, before the provisional joint-process, can be designed to be, for example, one micrometer or more and less than five micrometers. The outer diameter of the first bump 12 is elected to be less than the length of one side of the first land 11, for example, one micrometer or more and less than five micrometers.

The plurality of the second bumps 22c serving respectively as components of the bump-connecting mechanisms $B_{uv}$ also has the same dimension as each other. Nevertheless, the height of the cone of the second bump 22c will be set to be larger than the depth of the tubular sidewall-portion of the first bump 12. In FIG. 3, the diameter of the bottom surface of the second bump 22c represented at the upper side may be set to be larger than the diameter of the opening on the upper edge side of the sidewall-portion of the first bump 12. The length of one side of the second land 21 is set to be larger than the diameter of the bottom surface of the second bump 22c and is set to be, for example, one micrometer or more and less than five micrometers.

Each of the first land 11 and the second land 21 can be made of, for example, Au or alloy such as Au—Si, Au—Ge, Au—Sb, Au—Sn, Au—Pb, Au—Zn, Au—Cu containing 80% or more of Au. A composite structure using a metallic layer such as nickel (Ni) as a base may be used. Therefore, the first land 11 can reduce the contact resistance with the first bump 12, while the second land 21 can reduce the contact resistance with the second bump 22c.

Further, for the chip $X_{ij}$, a structure encompassing a first circuit-embedding insulating-layer laminated on the top surface of the support substrate, and a second circuit-embedding insulating-layer laminated on the top surface of the first circuit-embedding insulating-layer can be adopted. The first circuit-embedding insulating-layer has first and second lower-level interconnections arranged apart from each other on the top surface of the support substrate so that the first circuit-embedding insulating-layer buries the first and second lower-level interconnections. The second circuit-embedding insulating-layer has first and second intermediate-level interconnections arranged apart from each other on the top surface of the first circuit-embedding insulating-layer, so that the second circuit-embedding insulating-layer buries the first and second intermediate-level interconnections.

For the first lower-level interconnection, the second lower-level interconnection, the first intermediate-level interconnection, the second intermediate-level interconnection, and the like, a metallic layer, for example, made of aluminum (Al), aluminum-copper alloy (Al—Cu alloy), copper (Cu) damascene, and the like, can be adopted. The first circuit-embedding insulating-layer and the second circuit-embedding insulating-layer correspond to the multi-level interconnection-layer illustrated in FIG. 2, etc.

For an insulating layer of the multi-level interconnection-layer, for example, inorganic insulating layers such as a silicon oxide film ($SiO_2$ film), a silicon nitride film ($Si_3N_4$ film), a phosphoric silicate glass film (PSG film), a fluorine-containing oxide film (SiOF film), and a carbon-containing oxide film (SiOC film), as well as organic insulating layers such as methyl-containing polysiloxane (SiCOH) hydrogen-containing polysiloxane (HSQ), porous methylsilsesquioxane film, polyallylene film can be used, and it is possible to combine and laminate these various insulating film layers to implement the multi-level interconnection-layers having various laminated structures.

The second intermediate-level interconnection may be arranged so that an array corresponding to one row in a matrix or in a planar layout faces an array corresponding to one row in the planar layout of the second lower-level interconnection via the first circuit-embedding insulating-layer. The second intermediate-level interconnection is electrically connected to the second land 21 via a conductor, and the second lower-level interconnection is connected to the ground potential. As a result, if the stacked semiconductor device according to the first embodiment is supposed to be a solid-state imaging device, the second intermediate-level interconnection and the second lower-level interconnection implement the readout capacitor, which is a thin-film capacitor that store signals generated in each of the unit elements as electric charges.

Although it is not illustrated, a channel region in which a channel is formed between the first and second intermediate-level interconnections is provided in the inside of the multi-level interconnection-layer by applying a voltage to the first lower-level interconnection. As a result, if the stacked semiconductor device according to the first embodiment is supposed to be a solid-state imaging device, the first lower-level interconnection, the first and second intermediate-level interconnections may implement the switching element, which is a thin film transistor configured to read out the electric charge accumulated in the readout capacitor as the signals. The first lower-level interconnection may function as a gate electrode. The first and second intermediate-level interconnections may function as a drain electrode or a source electrode, and the like, respectively.

The gate electrode of the switching element, i.e., the first lower-level interconnection, is connected to the gate signal line extending in the row direction of a pixel (X-axis direction). The gate signal line is arranged for each row of pixels and is connected to each gate electrode in the same row. Each gate signal line is connected to a gate drive circuit (not illustrated), and gate drive signals are sequentially applied from the gate drive circuit. The gate drive signals are sequentially applied in the column direction in a predetermined scanning cycle.

Besides, the drain electrode of the switching element, that is, the first intermediate-level interconnection, is connected to the signal readout line, extending in the column direction of the matrix of the pixels. The signal readout line is arranged for each column of pixels and is connected to each drain electrode in the same column. Each signal readout line is connected to a readout drive circuit (not illustrated) and is sequentially scanned in the row direction (X-axis direction) by the readout drive circuit. As a result, the readout drive circuit reads out signals from each unit element in the row to which the gate drive signals are applied, sequentially in the row direction in each scanning cycle of the gate drive circuit.

As described above, if the stacked semiconductor device according to the first embodiment is supposed to be a solid-state imaging device, an image representing a two-dimensional distribution of incident electromagnetic waves is generated by converting the readout signals of each unit element (pixel) into pixel values in an image processing circuit (not illustrated), and then mapping the pixel values in accordance with each unit element.

Method for Manufacturing Cylindrical Bumps of the Stacked Semiconductor Device According to the First Embodiment First, on the first main surface, or the connection surface of the mother-substrate 81, in which the plurality of first lands 11 are arranged, a photoresist film is coated, with a thickness corresponding to the height before the provisional joint-process of a first bump 12 to be formed. By the photolithography technique, the pattern of an opening that exposes each top surface of the first land 11 is delineated in an inverse-tapered shape in which the inner diameter decreases from the bottom surface to the top surface of the photoresist film. Photolithography conditions such as photoresist material, exposure, and development are selected so that the inner surface at the opening has the smallest inner diameter at the upper edge.

Next, a metal such as Au or Au alloy is deposited by a sputtering method at an incident angle within a predetermined range with respect to the normal of the first main surface of the mother-substrate 81. Sputtered particles are deposited on the top surface of the first land 11 exposed by the opening, the inner surface of the opening, and the top surface of the photoresist film, respectively. The incidence angle of the sputtered particles and the distance between the target and the substrate are determined so that the sputtered particles are deposited on the entire surface of the top surface of the first land 11 exposed by the opening and the inner surface of the opening.

By injecting sputtered metal particles in an oblique direction, the bottom portion of the first bump 12 made of metal is built on the top surface of the first land 11 exposed by the opening, and the metal sidewall is built on the inner surface of the opening. Further, an upper metal film made of sputtered particles is built even on the top surface of the photoresist film.

Since the photoresist film pattern has the smallest inner diameter at the upper edge, metal particles are sputtered such that the lowest amount of sputtered particles is deposited at the upper edge of the sidewall-portion, and the thickness is thinnest at the upper edge. That is, as illustrated in FIG. 3, the sidewall-portion may have a thickness that decreases from the lower edge to the upper edge. Finally, the photoresist film and the upper metal film deposited on the top surface of the photoresist film are removed, and as illustrated in FIG. 3, the first bump 12 bonded to the top surface of the first land 11 is established.

As described above, the stacked semiconductor device according to the first embodiment can provide a stacked semiconductor device that facilitates selective repair of only a defective chip, among the plurality of chips $X_{ij}$ to be mounted on a larger-size mother-substrate 81, and the plurality of chips $X_{ij}$ used in the stacked semiconductor device. As a result, the stacked semiconductor device according to the first embodiment shortens the manufacturing time of the stacked semiconductor device, by mounting the plurality of chips $X_{ij}$ on the larger-size mother-substrate 81, and also eliminates the unnecessary loss of the normally operating mother-substrate 81 and normally operating chips $X_{ij}$, preventing the waste of resources.

Second Embodiment

Although it is not illustrated, a stacked semiconductor device according to a second embodiment of the present invention has a stacked structure with a larger-size mother-substrate 81, and a plurality of rectangular chips $X_{ij}$ (i=1 to n: j=1 to m) facing to the mother-substrate 81, similarly to the configurations illustrated in FIGS. 1 and 2. The mother-substrate 81 has a structure in which a plurality of unit elements, or a plurality of detection elements such as p-n diodes, n-i-n diodes, or p-i-p diodes are arranged in the unit-element areas, or the pixel areas, respectively, the unit-element areas are assigned to a first lattice. Although it is not illustrated, the mother-substrate 81 has two main surfaces, a first main surface (connection surface) and a second main surface facing to the first main surface.

If the stacked semiconductor device is supposed to be a solid-state imaging device, the second main surface is an entrance surface on which the electromagnetic waves $\Phi_x$ are incident, as illustrated in FIG. 2. A plurality of chip-mounting areas is defined on the first main surface along a second lattice such as 2×2 matrix to 8×8 matrix, corresponding to the size of the mother-substrate 81. Like the stacked semiconductor device according to the first embodiment, the mesh number of the second lattice is smaller than that of the first lattice. The plurality of chips $X_{ij}$ is arranged to cover almost the entire surface of the first main surface of the mother-substrate 81.

In the description of the stacked semiconductor device according to the second embodiment, a plurality of bump-connecting mechanisms, including other bump-connecting mechanisms existing elsewhere other than the portion illustrated in the cross-section of FIG. 2, are collectively referred to as "bump-connecting mechanism $B_{uv}$." Besides, in the stacked semiconductor device according to the second embodiment, each of the bump-connecting mechanisms $B_{uv}$ is assigned to a site defined by a third lattice, having the same mesh number as the first lattice. And, the bump-connecting mechanisms $B_{uv}$ are arranged so that each of the unit elements arranged in each of the unit elements area is assigned to a site defined by the first lattice on the first main surface of the mother-substrate 81. And furthermore, each of the corresponding chips $X_{ij}$ are electrically connected independently to the unit elements, respectively. Like the stacked semiconductor device according to the first embodiment, the mesh pitch of the third lattice may be the same as that of the first lattice, but the mesh pitch may also have a value obtained by the pitch conversion of the first lattice.

As explained in the stacked semiconductor device according to the first embodiment, the mother-substrate 81 is fabricated under a lax and lough design rule, and the mother-substrate 81 is simple in terms of a circuit layout. Therefore, even if there is a defect, the occurrence of defects is random, and defects is hardly visible from the output side. On the other hand, each of the chips $X_{ij}$ has a high degree of integration, and the performance and behavior of the circuit merged in the chip $X_{ij}$ cannot be known until testing is conducted, after jointing each of the chips $X_{ij}$ to the mother-substrate 81 with the bump-connecting mechanism $B_{uv}$. If one of the connected chips $X_{ij}$ has a high defect-occurrence rate or block defects, the stacked semiconductor device according to the second embodiment becomes defective. Therefore, after the prepared chips $X_{ij}$ are provisionally jointed temporarily to the mother-substrate 81, and if a circuit merged in a specific chip $X_{st}$ is defective, it is necessary to carry out repair process of the specific chip $X_{st}$, by peeling off the specific chip $X_{st}$, and then, provisionally jointing another chip $X_{xy}$ again to the mother-substrate 81 so as to confirm whether or not there is a problem in the another chip $X_{xy}$.

The array of unit elements arranged on the first main surface of the mother-substrate 81 corresponds to the array of pixels of an image sensor (a stacked-semiconductor device). Each of the signal-readout circuits of the plurality of the chips $X_{ij}$ includes a switching element $Q_{ij}$ and a buffer amplifier circuit. Each of the chips $X_{ij}$ reads out signals from the pixels, which are arranged on each of the corresponding divided areas, along the first lattice, in the first main surface of the mother-substrate 81.

Although the following description of the second embodiment also does not limit the material and the use of the mother-substrate 81, the mother-substrate 81 arranges a plurality of substrate-side connection-elements, each of which implements a component in each of the bump-connecting mechanisms $B_{uv}$. The array of the bump-connecting mechanisms $B_{uv}$ corresponds to the array of unit elements on the first main surface, which is one of the main surfaces. The substrate-side connection-elements are deployed in each site of the third lattice, which has the same mesh number as that of the first lattice. Each of the substrate-side connecting portions encompasses a first land 11 illustrated in FIG. 6, and a first bump 12r whose bottom surface is in contact with the first land 11.

Figure 6:
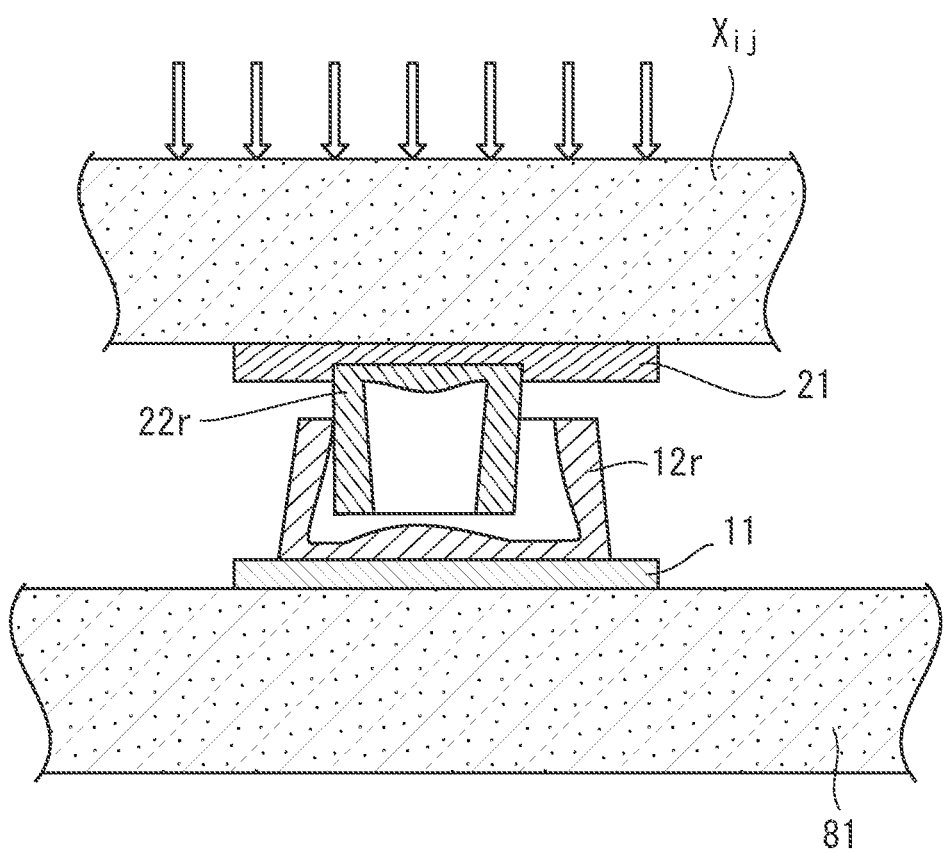
FIG. 6 is a schematic cross-sectional view for explaining the state of provisional joint-process of the bump-connecting mechanism of a stacked semiconductor device according to a second embodiment of the present invention.

If the stacked semiconductor device according to the second embodiment is supposed to be a solid-state imaging device, the signals, which are carriers generated as electron-hole pairs in a carrier-generation layer of each unit element, are read out from the first land 11 of each unit element. A plurality of unit elements is arranged in the unit-element areas assigned to the first lattice defined on the mother-substrate 81. As illustrated in FIG. 6, a portion of the mother-substrate 81 corresponding to the first land 11 implements each of the unit elements. Each of the unit elements serves as a detection element corresponding to one pixel that delivers the signals, which depend on the amount of received electromagnetic waves. The chip $X_{ij}$ has a bottom surface (chip surface) of the chip $X_{ij}$ as the readout-circuit main-surface.

When the stacked semiconductor device according to the second embodiment is supposed to be a solid-state imaging device, the first lands 11 are two-dimensionally arranged apart from each other on the bottom surface of the chip $X_{ij}$ as illustrated in FIG. 2, and the signals indicating carriers generated in the mother-substrate 81 are read out from the first land 11. As a result, the mother-substrate 81 functions as a detection substrate for detecting electromagnetic waves, while the first land 11 functions as an output electrode of the unit element, namely, the first land 11 receives carrier-signals from each of the unit elements, or from each of the pixels.

Although the illustration of the detailed structure is omitted, for example, the chip $X_{ij}$ may have a laminated structure of a support substrate made of a semiconductor substrate and a multi-level interconnection-layer arranged on the support substrate. Inside the multi-level interconnection-layer, inter-mediate-level interconnection and lower-level interconnection are embedded apart from each other to implement a thin-film integrated-circuit. The signal-readout circuit of the chip $X_{ij}$ is connected to a second land 21, and the second land 21 is connected to the second bump 22r, which is metallurgically (physically) jointed to the first bump 12r.

The second land 21 and the second bump 22r of the chip-side connection-element implement a component of each bump-connecting mechanism $B_{uv}$. And, the first bump 12r is further connected to the first land 11.

As a result, the signals are transmitted from the mother-substrate 81 to each of the signal-readout circuits via the first land 11. Therefore, the chip $X_{ij}$ functions as "a readout chip" having a plurality of input electrodes, which are arranged along a third lattice in accordance with the pixel array. Each of the chips $X_{ij}$ merges signal-readout circuits that read out signals from the mother-substrate 81, and a plurality of the signal-readout circuits are arranged along the third lattice. Further, each of the second lands 21 functions as "an input electrode" that reads out the signals from each of the unit elements via the first land 11, and a plurality of second lands 21 feeds the signals to the corresponding integrated circuit, which is merged in the corresponding chip $X_{ij}$ respectively.

As already mentioned, the chip $X_{ij}$ has a high degree of integration, and the performance and behavior of the chip $X_{ij}$ cannot be known, until the chip $X_{ij}$ is connected to the mother-substrate 81, through the bump-connecting mechanism $B_{uv}$. If a circuit merged in a specific chip $X_{st}$ is defective, the entire stacked semiconductor device according to the second embodiment becomes defective. Therefore, it is necessary to provisionally assemble temporarily each chip $X_{ij}$ on the mother-substrate 81, and check whether or not there is a defect in any circuit merged in any specific chip $X_{st}$. Therefore, as illustrated in FIG. 6, according to the bump-connecting mechanism $B_{uv}$ of the stacked semiconductor device pertaining to the second embodiment, a first bump 12r with its bottom portion bonded to the first land 11 and a second bump 22r with its bottom portion bonded to the second land 21 are brought into contact with each other so as to execute a provisional joint-process, or a temporary joint-process.

As illustrated in FIG. 6, the first bump 12r, constructing a component of the bump-connecting mechanism $B_{uv}$ of the stacked semiconductor device according to the second embodiment, has a tubular shape including a bottom portion in contact with the first land 11 and a sidewall-portion connected to the outer periphery of the bottom portion, and the sidewall-portion implements the peripheral wall surrounding the bottom portion. As illustrated in FIG. 7A, the first bump 12r can encompass a rectangular bottom portion in contact with the first land 11 (not illustrated) and a rectangular tubular sidewall-portion connected to the outer periphery of the bottom portion, and the sidewall-portion implements the peripheral wall surrounding the bottom portion. The sidewall-portion of the first bump 12r has an inverse-tapered shape in which the inner and outer diameters decrease from the lower edge to the upper edge.

The second bump 22r, constructing a component of the bump-connecting mechanism $B_{uv}$ of the stacked semiconductor device according to the second embodiment, has a tubular shape whose bottom portion is in contact with the second land 21. Although the second bump 22r has a rectangular tubular shape whose bottom portion is in contact with the second land 21, a longitudinal direction, or a direction along the longer side of the second bump 22r is perpendicular to the longitudinal direction of the first bump 12r, as illustrated in FIG. 7A. The sidewall-portion of the second bump 22r has an inverse-tapered shape in which the inner and outer diameters decrease from the "lower edge" represented at the upper side in FIG. 8 to the upper edge represented at the lower side in FIG. 8.

Figure 7C:
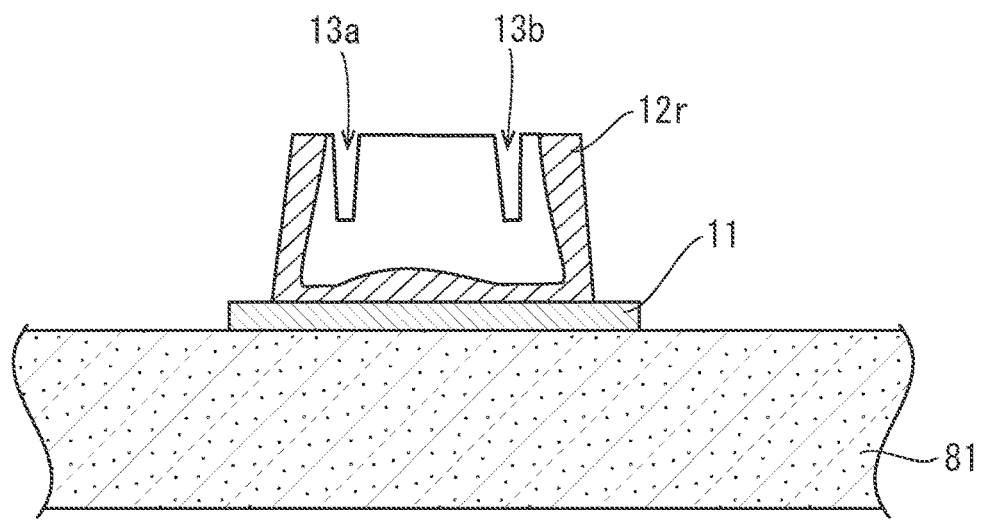
FIG. 7C is a schematic cross-sectional view illustrating a groove formed at the upper edge of the sidewall-portion of the first bump after the bump-connecting mechanism is provisionally jointed temporarily.

Because each sidewall-portion of the first bump 12r and the second bump 22r has the inverse-tapered shape, if an upper edge of the sidewall-portion of the first bump 12r is pressed by the sidewall-portion of the second bump 22r, the upper edge of the sidewall-portion of the first bump 12r is deformed to cut a recess (groove) 13a and another recess (groove) 13b illustrated in FIG. 7C, as the sidewall-portion of the second bump 22r bites the upper edge of the sidewall-portion of the first bump 12r. And the second bump 22r is bonded to the first bump 12r. The planar patterns of the first land 11 and the second land 21 may be, for example, a square shape, but are not limited to the square shape.

The planar pattern of the bump-connecting mechanism $B_{uv}$ implementing the stacked semiconductor device according to the second embodiment may be the rectangular shape illustrated in FIG. 7A or the circular shape illustrated in FIG. 7B. Although the first bump 12r and the second bump 22r have been described as "rectangular" in FIG. 7A, the planar patterns may be rounded rectangular or oblong circular, ascribable to process reasons. The first bump 12r and the second bump 22r may have an elliptical shape, etc.

The first bump 12s with the cylindrical sidewall-portion illustrated in FIG. 7B has its bottom portion in contact with the first land 11 (not illustrated). The second bump 22s with the cylindrical sidewall-portion illustrated in FIG. 7B has its bottom portion in contact with the second land 21. Although the illustration is omitted, the sidewall-portion of the first bump 12s has an inverse-tapered shape in which the inner and outer diameters decrease from the lower edge to the upper edge.

Figure 8:
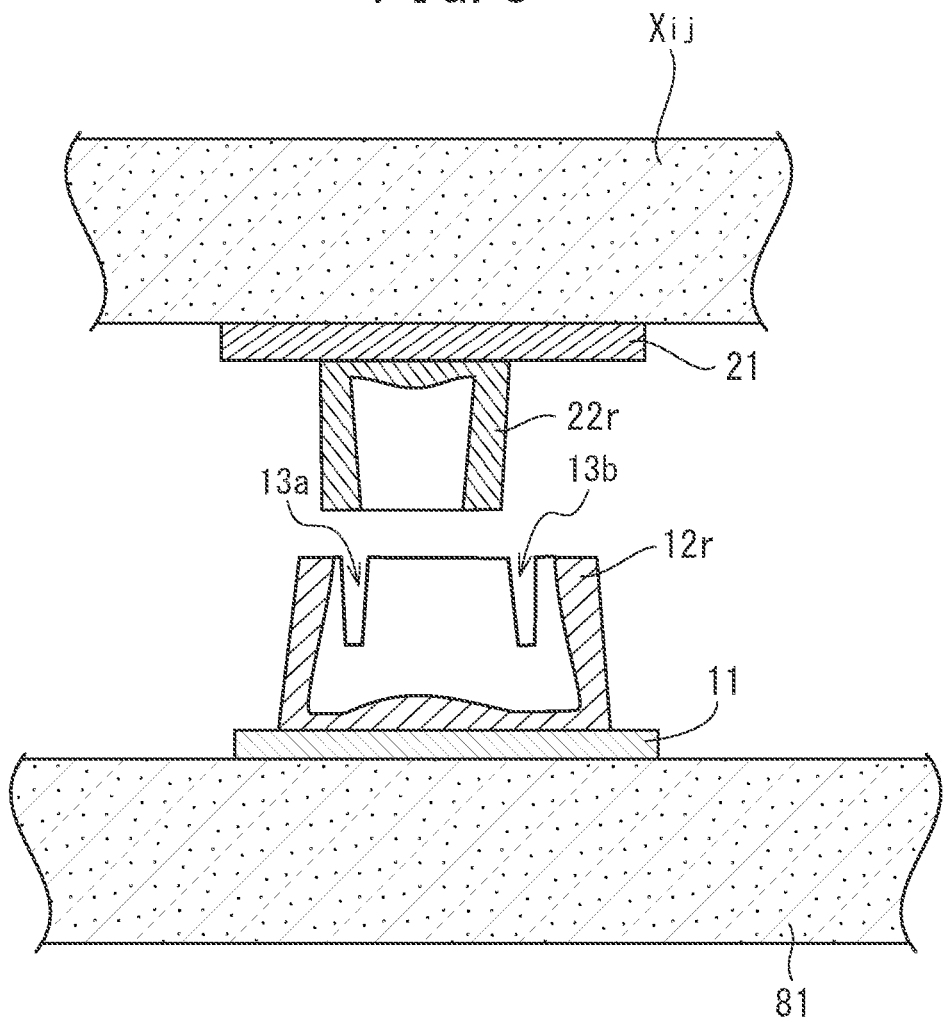
FIG. 8 is a schematic cross-sectional view for explaining the state of re-separation when a defect is found by the provisional joint-process of the bump-connecting mechanism of the stacked semiconductor device according to the second embodiment.

Similarly, the sidewall-portion of the second bump 22s can be illustrated as an inverse-tapered shape in which the inner and outer diameters decrease from the "lower edge", represented at the upper side, to the upper edge, represented at the lower side, if a schematic cross-sectional view is drawn to visualize a cross-sectional structure corresponding to the schematic cross-sectional view of FIG. 8. Since the first bump 12r with a rectangular tubular sidewall-portion having an inverse-tapered shape, and the first bump 12s with a cylindrical sidewall-portion can be manufactured by the same method as the manufacturing method of the first bump 12 of the stacked semiconductor device according to the first embodiment, a duplicate description will be omitted. The sidewall-portions of the second bumps 22r and 22s having an inverse-tapered shape can also be manufactured by the same method as the manufacturing method of the first bump 12 of the stacked semiconductor device according to the first embodiment.

As to the relationship on the planar pattern, a portion of the cylindrical second bumps 22s intersect with the cylindrical first bump 12s, as illustrated in FIG. 7B. Because each sidewall-portion of the first bump 12s and the second bump 22s has an inverse-tapered shape, if the upper edge of the sidewall-portion of the first bump 12s is pressed by the lower edge of the sidewall-portion of the second bump 22s, the upper edge of the sidewall-portion of the first bump 12s is deformed to be cut the recesses (grooves), and the second bump 22s is bonded to the first bump 12s.

FIGS. 6 and 7A-7C illustrate one of the plurality of the bump-connecting mechanisms $B_{uv}$ as a representative example, but the same applies to the other bump-connecting mechanisms $B_{uv}$, and the plurality of the bump-connecting mechanisms $B_{uv}$ are respectively sandwiched between the plurality of the second lands 21 and the plurality of the first lands 11. When the first bump 12r and the second bump 22r are provisionally jointed temporarily as illustrated in FIG. 6, the upper edge of the sidewall-portion of the first bump 12r of the stacked semiconductor device according to the second embodiment is metallurgically jointed to a part of the lower edge of the sidewall-portion of the second bump 22r, and as illustrated in FIG. 7C, and the upper edge of the sidewall-portion is deformed.

As illustrated in FIG. 7A, the provisional joint-process of the first bump 12r having a rectangular tubular sidewall-portion and the second bump 22r having a rectangular tubular sidewall-portion to each other cuts four grooves 13a, 13b, 13c, and 13d at the upper edge of the sidewall-portion of the first bump 12r, as the sidewall-portion of the second bump 22r bites and thrusts into the upper edge of the sidewall-portion of the first bump 12r. On the other hand, as illustrated in FIG. 7B, when the first bump 12s and the second bump 22s having the cylindrical sidewall-portion are provisionally jointed temporarily to each other, two grooves are cut at the upper edge of the sidewall-portion of the first bump 12s.

In the stacked semiconductor device according to the second embodiment, as illustrated in FIG. 6, the provisional joint-process between the first bump 12r and the second bump 22r confirms the operation of the chip $X_{ij}$. If a defect in the chip $X_{ij}$ is found in the operation check of the chip $X_{ij}$ in the state where the first bump 12r and the second bump 22r are provisionally jointed temporarily, the chip $X_{ij}$ can be detached again, as illustrated in FIG. 8. By provisionally jointing the first bump 12r and the second bump 22r, two grooves 13a and 13b are cut at the upper edge of the sidewall-portion of the first bump 12r.

Figure 9:
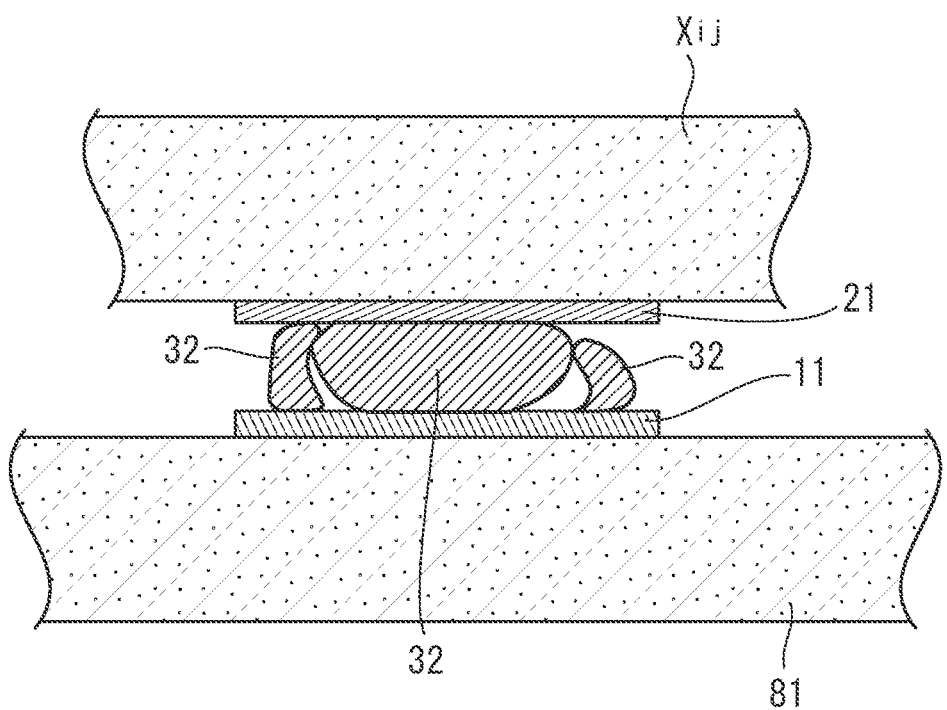
FIG. 9 is a schematic cross-sectional view for explaining the state of the non-provisional joint-process of the bump-connecting mechanism of the stacked semiconductor device according to the second embodiment.

On the other hand, when a normal operation of the chip $X_{ij}$ is confirmed, by provisionally jointing temporarily the first bump 12r and the second bump 22r, the force for pressing the chip $X_{ij}$ against the mother-substrate 81 further increases so that the distance between the chip $X_{ij}$ and the mother-substrate 81 further decreases. Further, when the force for pressing the chip $X_{ij}$ against the mother-substrate 81 increases, the non-provisional joint-process between the chip $X_{ij}$ and the mother-substrate 81 is executed, as illustrated in FIG. 9. In the stacked semiconductor device according to the second embodiment, during the non-provisional joint-process between the first bump 12r and the second bump 22r, the pressing process deforms the sidewall-portion of the first bump 12r, as illustrated in FIG. 9. and then the tip at the lower edge side of the second bump 22r is metallurgically jointed to the bottom portion of the first bump 12r. Since the pressing process makes compression, the height of the bump-connecting mechanism $B_{uv}$ at the stage of the non-provisional joint-process illustrated in FIG. 9 becomes lower than the height of the bump-connecting mechanism $B_{uv}$ at the stage of the provisional joint-process illustrated in FIG. 6.

Figure 10:
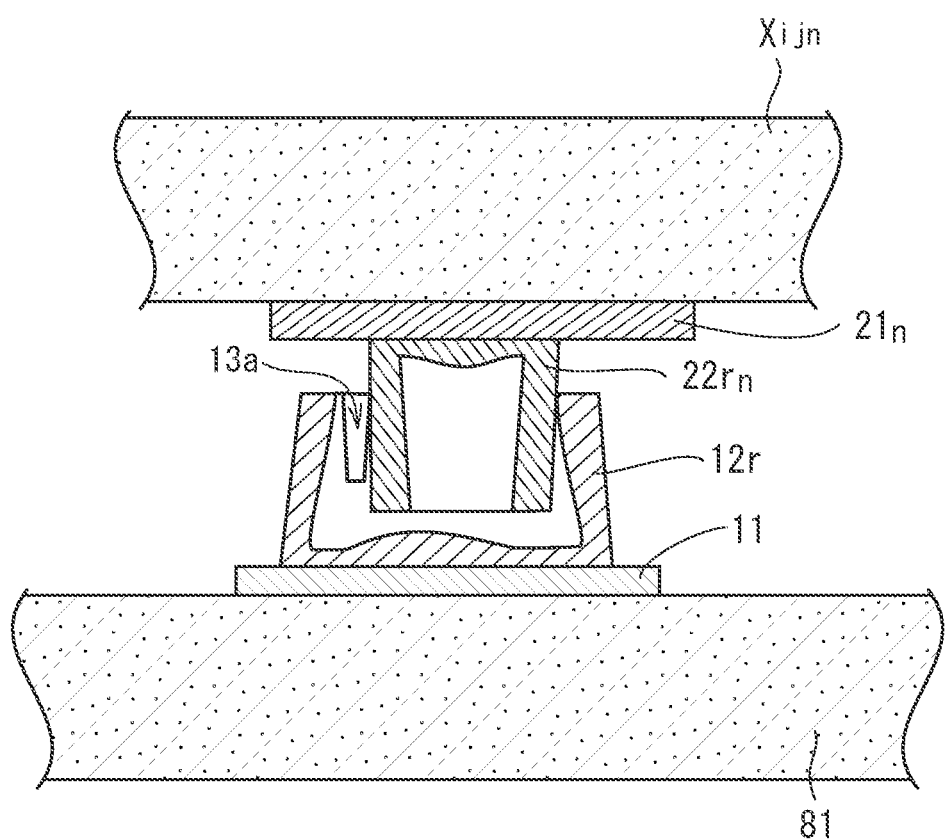
FIG. 10 is a schematic cross-sectional view for explaining the state of being provisionally jointed temporarily using a new chip when a defect is found by the provisional joint-process of the bump-connecting mechanism of the stacked semiconductor device according to the second embodiment.

When re-separated as illustrated in FIG. 8, a new chip $X_{ijn}$ having a new second bump 22rn is prepared as illustrated in FIG. 10, and a new second bump 22rn is provisionally jointed temporarily again to the first bump 12r. In the further provisional joint-process, the upper edge of the sidewall-portion of the first bump 12r of the stacked semiconductor device according to the second embodiment is metallurgically jointed to a part of a lower edge of the sidewall-portion of the new second bump 22rn at positions different from the locations illustrated in FIG. 8. That is, in the further provisional joint-process illustrated in FIG. 10, the upper edge of the sidewall-portion of the first bump 12r of the stacked semiconductor device according to the second embodiment is metallurgically jointed to a part of the lower edge of the sidewall-portion of the new second bump 22rn at positions different from the locations illustrated in FIG. 8.

When a defect of the new chip $X_{ijn}$ is found in the confirmation of the operation of the new chip $X_{ijn}$ in the state where the first bump 12r and the new second bump 22rn are provisionally jointed temporarily, further re-separation is possible as illustrated in FIG. 8. On the other hand, if the normal operation of the new chip $X_{ijn}$ is confirmed, in the state where the first bump 12r and the new second bump 22rn are provisionally jointed temporarily, the force for pressing the new chip $X_{ijn}$ against the mother-substrate 81 further increases, and the distance between the new chip $X_{ijn}$ and the mother-substrate 81 further decreases.

The further increase of the force for pressing the new chip $X_{ijn}$ against the mother-substrate 81 establishes the non-provisional joint-process between the new chip $X_{ijn}$ and the mother-substrate 81, as illustrated in FIG. 9. According to the stacked semiconductor device pertaining to the second embodiment, during the time of the non-provisional joint-process between the first bump 12r and the second bump 22 or the new second bump 22rn, the force pressing the sidewall-portion of the first bump 12r deforms the first bump 12r, as illustrated in FIG. 9, and then the tip at the lower edge of the second bump 22 or the new second bump 22rn is metallurgically jointed to the bottom portion of the first bump 12r.

As already described in the stacked semiconductor device according to the first embodiment, Au is preferred for the first bump 12r and the second bumps 22r, 22rn, and 22s of the stacked semiconductor device according to the second embodiment, because of the ease of deformation. The ease of deformation of Au allows the easy and reliable processes of a plurality of times of the metallurgical joints, which include non-provisional joint-processes and a plurality of times of the provisional joint-processes.

The plurality of first bumps 12r, which serve respectively as components of the bump-connecting mechanisms $B_{uv}$, has the same dimensions mutually, and the height of the first bumps 12r can be determined, for example, to be one micrometer or more and less than five micrometers. The outer diameter of the first bump 12r is elected to be less than the length of one side of the first land 11, for example, one micrometer or more and less than five micrometers.

The new second bumps 22r, 22rn, 22s serving respectively as components of the bump-connecting mechanisms $B_{uv}$, also have the same dimensions mutually. And, the heights of the sidewall-portions of the new second bumps 22r, 22rn, and 22s may be set approximately the same as the depths of the sidewall-portions in the first bumps 12r and 12s, respectively. The length of one side of the second land 21 is set to be larger than the diameters of the bottom surfaces of the new second bumps 22r, $22r_n$, and 22s, for example, to be one micrometer or more and less than five micrometers.

Each of the first land 11 and the second land 21 can be made of, for example, Au or an alloy containing 80% or more of Au, and may have a composite structure using a metallic layer such as Ni as a base. By using Au, etc., as materials of the first land 11 and the second land 21, the first land 11 can reduce the contact resistance with the first bumps 12r and 12s, and the second land 21 can reduce the contact resistance with the second bumps 22r, $22r_n$, and 22s.

As described above, the stacked semiconductor device according to the second embodiment of the present invention can provide a stacked semiconductor device that facilitates selective repair of only a defective chip, among the plurality of chips $X_{ij}$ to be mounted on a larger-size mother-substrate 81, and furthermore, the stacked semiconductor device according to the second embodiment can provide the plurality of chips $X_{ij}$ used in the stacked semiconductor device. As a result, the stacked semiconductor device according to the second embodiment shortens the manufacturing time of the stacked semiconductor device, which mounts the plurality of chips $X_{ij}$ on the larger-size mother-substrate 81. And, the stacked semiconductor device according to the second embodiment eliminates unnecessary loss of the mother-substrate 81 and unnecessary loss of the normal operating chip $X_{ij}$, which prevent the waste of resources.

Other Embodiments

As described above, the first and second embodiments of the present invention have been described, but because Specifications and Drawings implement a mere part of the disclosure of the present invention, and it should not be understood that Specifications and Drawings are intended to limit the scope of the present invention. Various alternative embodiments, examples and operational techniques will become apparent to those skilled in the art from the above disclosure.

An exemplary description has been made for the case in which as the stacked semiconductor device according to the first and second embodiments of the present invention, such that the larger-size mother-substrate 81 is a detector substrate, on which a plurality of detection elements such as photodiodes are arranged in a matrix form as pixels, and a plurality of chip $X_{ij}$ is exemplified as a semiconductor chip into which a readout circuit for reading out signals from each pixel is integrated, respectively, but the stacked semiconductor device of the present invention is not limited to a solid-state imaging device. For example, the mother-substrate 81 may be used as a main memory such as a dynamic random-access memory (DRAM) or a static random-access memory (SRAM), and a plurality of chips $X_{ij}$ into each of which an arithmetic logic unit (ALU) is integrated may be mounted on the main memory to implement the stacked semiconductor device. Mounting the plurality of chips $X_{ij}$ that merges the ALU on divided areas of the main memory would realize a parallel computer, by which the plurality of chips $X_{ij}$ processes the signals from each of the divided blocks of the main memory in parallel, thereby executing parallel computing, or pipelining in the parallel computing.

As described above, the technical subject matters described in the first and second embodiments are merely examples, and the subject matters can be applied to miscellaneous and various configurations or technical features, and the like, in which each the exemplified configurations or the exemplified technical features of the first and second embodiments is arbitrarily modified. Therefore, the present invention naturally includes various modifications or embodiments, which are not described in the stacked semiconductor device according to the first and second embodiments. Therefore, the technical scope of the present invention includes various technical subject matters that can be interpreted as appropriate from the above description, and technical subject matters are defined only by the matters specifying the invention prescribed by the scope of claims.

REFERENCE SIGNS LIST

11 . . . first land
12, 12r, 12s . . . first bump
13a, 13b, 13c, 13d . . . groove portion
21 . . . second land
22c, 22r, 22rn, 22s . . . second bump
81 . . . mother-substrate $B_{11}$, $B_{12}$, $B_{13}$, $B_{21}$, $B_{22}$, $B_{23}$, $B_{uv}$ . . . bump-connecting mechanism $X_{21}$, $X_{22}$, $X_{2m}$, $X_{ij}$, $X_{st}$, $X_{xy}$, . . . chip

The invention claimed is:

1. A separatable stacked semiconductor device configured to facilitate a repair process with a provisional joint-process, the separable stacked semiconductor device comprising:
   a mother-substrate having a first main surface and a second main surface facing to the first main surface, and a plurality of unit elements arranged in each of unit-element areas assigned to a first lattice defined on the first main surface, the first main surface is divided into a plurality of chip-mounting areas along a second lattice having a smaller number of meshes than the first lattice;
   a plurality of rectangular chips mounted on the first main surface side, each of the chips facing to corresponding site of the chip-mounting areas, respectively; and
   a plurality of bump-connecting mechanisms including a plurality of substrate-side connection-elements and a plurality of chip-side connection-elements, configured to connect the mother-substrate and each of the chips by a non-provisional joint-process between the mother-substrate and the chips through deformations of the substrate-side connection-elements by increasing a force for pressing the chips against the mother-substrate, so that a height between the mother-substrate and the chips at the non-provisional joint-process becomes lower than the height at the provisional joint-process jointing the mother-substrate and the plurality of the chips, being arranged along a third lattice corresponding to the arrangement of the plurality of the unit elements, the provisional joint-process is configured to transmit signals from the plurality of the unit elements independently, for testing of circuits merged in the plurality of the chips,
   wherein, after the provisional joint-process, at least one of chip-side connection-elements can be peeled off from corresponding one of the substrate-side connection-elements and replaced with a new chip, if any defect is found in the testing.

2. The separatable stacked semiconductor device of claim 1, wherein the plurality of substrate-side connection-elements comprises a plurality of first lands arranged along the third lattice, configured to deliver signals from each of the unit-elements, respectively; and
   the plurality of chip-side connection-elements comprises a plurality of second lands arranged on a chip surface of each of the chips, the chip surface is facing to the first main surface, along the third lattice, configured to feed the signals to each of the circuits merged in the plurality of the chips, respectively.

3. The separatable stacked semiconductor device of claim 2, wherein each of the plurality of the substrate-side connection-elements further comprises a first bump having:
   a bottom portion in contact with the first land, and
   a cylindrical sidewall-portion connected to the outer periphery of the bottom portion.

4. The separatable stacked semiconductor device of claim 3, wherein each of the plurality of the chip-side connection-elements further comprises a second bump whose bottom surface is in contact with the second land, configured to metallurgically joint to a part of the sidewall-portion of the first bump, under the provisional joint-process.

5. The separatable stacked semiconductor device of claim 3, wherein the second bump includes a cone having a conical shape whose bottom surface is in contact with the second land, and an upper edge of the sidewall-portion of the first bump is metallurgically jointed to a part of the conical surface of the cone, under the provisional joint-process.

6. The separatable stacked semiconductor device of claim 4, wherein the second bump includes a bottom portion in contact with the second land, and a tubular sidewall-portion connected to an outer periphery of the bottom portion,
   wherein an upper edge of the sidewall-portion of the first bump is deformed to cut recesses, as the sidewall-portion of the second bump bites the upper edge of the sidewall-portion of the first bump, under the provisional joint-process.

7. A combination of a plurality of separatable chips, each of the separatable chips is supposed to be mounted respectively on corresponding chip-mounting areas defined on a mother-substrate configured to facilitate a repair process with a provisional joint-process, the mother-substrate having a first main surface and a second main surface facing to the first main surface, and a plurality of unit elements are arranged in each of unit-element areas assigned to a first lattice defined on the first main surface, the first main surface is divided into the chip-mounting areas along a second lattice having a smaller number of meshes than the first lattice, the mother-substrate has a plurality of substrate-side connection-elements for delivering each of signals from the plurality of the unit elements, each of the substrate-side connection-elements is assigned to a third lattice defined on the first main surface so that third lattice corresponds to an array of the unit elements, the number of chips is larger than the number of meshes of the second lattice, each of the separatable chips comprising:
   a plurality of chip-side connection-elements feeding the signals to a circuit merged in each of the separatable chips, arranged along the third lattice on a chip surface of each of the separatable chips, the chip surface is facing to the first main surface,
   wherein, the mother-substrate and the plurality of the chips are provisionally jointed for conducting a testing of circuits merged in the plurality of the chips, and signals from the plurality of the unit elements are independently transmitted to the circuits to inspect normal operations of the chips during the testing,
   in a case of a defect determination such that a specific chip is determined to be defective by the testing, the specific chip is removed from the chip mounting area by peeling off the chip-side connection-element of the specific chip from corresponding one of the substrate-side connection-elements, so that a new chip is provisionally jointed again,
   when all of the chips mounted on the mother-substrate is determined to be normal, the mother-substrate and the plurality of the chips are coupled to each other by a non-provisional joint-process through increasing a force for pressing the chips against the mother-substrate to deform the substrate-side connection-elements, thereby decreasing the height between the chips and the mother-substrate at the non-provisional joint-process lower than the value at the provisional joint-process.

8. The combination of claim 7, wherein the plurality of substrate-side connection-elements comprises a plurality of first lands arranged along the third lattice and a plurality of first bumps, each having a bottom portion in contact with the first land, and a cylindrical sidewall-portion connected to the outer periphery of the bottom portion, configured to deliver signals from each of the unit-elements, respectively; and the plurality of chip-side connection-elements comprises a plurality of second lands arranged on a chip surface of each of the separatable chips, respectively, the chip surface is facing to the first main surface, along the third lattice, and a plurality of second bumps whose bottom surfaces are in contact with the second lands, respectively, configured to metallurgically joint respectively to corresponding parts of the sidewall-portions of the first bumps, under the provisional joint-process, each of second lands is configured to feed the signals to each of the circuits, respectively.

9. The combination of claim 8, wherein each of the second bumps includes a cone having a conical shape whose bottom surface is in contact with the corresponding second land in the plurality of the second lands, and an upper edge of the sidewall-portion of the first bump is metallurgically jointed to a part of the conical surface of the cone, under the provisional joint-process.

10. The combination of claim 8, wherein each of the second bumps includes a bottom portion in contact with the corresponding second land in the plurality of the second lands, and a tubular sidewall-portion connected to an outer periphery of the bottom portion, wherein an upper edge of the sidewall-portion of each of the first bumps is deformed to cut recesses, as each of the sidewall-portions of the second bumps bites the upper edge of the corresponding sidewall-portion of the first bump, under the provisional joint-process.

* * * * *